(12) United States Patent
Sasaki et al.

(10) Patent No.: US 7,626,129 B2
(45) Date of Patent: Dec. 1, 2009

(54) ELECTRONIC APPARATUS

(75) Inventors: Koichi Sasaki, Kanagawa (JP); Haruhiko Sekino, Kanagawa (JP); Hideki Matsumoto, Tokyo (JP); Masami Nakayama, Kanagawa (JP)

(73) Assignee: Panasonic Corporation, Osaka (JP)

( * ) Notice: Subject to any disclaimer, the term of this patent is extended or adjusted under 35 U.S.C. 154(b) by 553 days.

(21) Appl. No.: 11/572,221

(22) PCT Filed: Jul. 27, 2005

(86) PCT No.: PCT/JP2005/013697

§ 371 (c)(1),
(2), (4) Date: Jan. 17, 2007

(87) PCT Pub. No.: WO2006/011496

PCT Pub. Date: Feb. 2, 2006

(65) Prior Publication Data

US 2008/0041624 A1 Feb. 21, 2008

(30) Foreign Application Priority Data

Jul. 29, 2004 (JP) ............................. 2004-221136

(51) Int. Cl.
*H01R 13/46* (2006.01)
(52) U.S. Cl. ............... 174/520; 174/17 VA; 454/184
(58) Field of Classification Search ............ 174/520, 174/564, 17 VA; 454/184; 361/692, 690
See application file for complete search history.

(56) References Cited

U.S. PATENT DOCUMENTS

| | | | |
|---|---|---|---|
| 4,921,124 A | | 5/1990 | Stammler et al. |
| 5,668,349 A | * | 9/1997 | Durham et al. .......... 174/17 VA |
| 5,692,637 A | * | 12/1997 | Hodge ..................... 220/366.1 |
| 6,506,110 B1 | * | 1/2003 | Borisch .................... 454/184 |
| 6,904,933 B2 | * | 6/2005 | Oyamada .................. 137/541 |
| 7,183,500 B2 | * | 2/2007 | Campini et al. ............ 174/392 |
| 7,199,310 B2 | * | 4/2007 | Cochrane .................. 174/383 |
| 7,465,887 B2 | * | 12/2008 | Suzuki ...................... 174/520 |
| 2004/0007347 A1 | * | 1/2004 | Stoller ....................... 165/47 |
| 2004/0077304 A1 | * | 4/2004 | Pfannenberg ............. 454/184 |

(Continued)

FOREIGN PATENT DOCUMENTS

JP 2001-007560 A 1/2001

(Continued)

OTHER PUBLICATIONS

International Search Report for Application No. PCT/JP2005/013697, dated Oct. 18, 2005.

*Primary Examiner*—Hung V Ngo
(74) *Attorney, Agent, or Firm*—RatnerPrestia

(57) ABSTRACT

A case has a penetrating hole, which is provided with a breathable film. A protective structure comprises a protective ring and a protective cap, and is provided outside the case so as to cover the breathable film. A gap between the protective ring and the protective cap is an opening connecting the inside and outside of the protective structure. In a cross-sectional view, an outside upper edge of the opening (i.e. point B) is positioned on or inside a straight line connecting an outer edge of the breathable film (i.e. point C) and an inside lower edge of the opening (i.e. point A). The breathable film can be protected from an intentional load applied thereto.

5 Claims, 5 Drawing Sheets

U.S. PATENT DOCUMENTS

2004/0198213 A1* 10/2004 Knight .................. 454/184

FOREIGN PATENT DOCUMENTS

| JP | 2001-332871 | A | 11/2001 |
| JP | 2002-185156 | A | 6/2002 |
| JP | 2003-258444 | A | 9/2003 |
| JP | 2003-336874 | A | 11/2003 |
| JP | 2004-172332 | A | 6/2004 |

* cited by examiner

US 7,626,129 B2

ELECTRONIC APPARATUS

This application is a U.S. National Phase Application of PCT International Application PCT/JP2005/013697.

TECHNICAL FIELD

The present invention relates to an electronic apparatus for housing a circuit board or other electronic components, and particularly to an electronic apparatus provided with a ventilation means (ventilation structure).

BACKGROUND ART

In conventional electronic equipment, as shown in FIG. 7, a cover element 102 of a case 100 is provided with a ventilation hole 104, which is covered with a breathable film 106. The breathable film 106 has, for example, a structure in which a water-repellent/oil-repellent layer 108 comprising polyethylene terephthalate (PET) or the like is laminated with a porous layer 110 which comprises PTFE or the like. The breathable film 106 thus has a property of blocking passage of liquid but allowing passage of gas.

In the example of FIG. 7, a welded portion 112 is formed in an outer region of the porous layer 110. The welded portion 112 is a part where the water-repellent/oil-repellent layer 108 is not laminated. On the other hand, the cover element 102 has a circular welding portion 114 on the rim of the ventilation hole 104. With the tip of the welding portion 114 being welded to the welded portion 112, the breathable film 106 is attached to the case 100.

In such a conventional apparatus, a breathable film is placed below a surface of a case. This prevents damage to the breathable film caused by contact with a foreign body. A conventional apparatus like this is disclosed, for example, in Japanese Published Patent Application No. 2003-258444 (second and third pages, and FIG. 3).

However, in conventional electronic equipment, damage to the breathable film may occur when a high pressure cleaning nozzle is intentionally directed at the breathable film, when the breathable film is intentionally poked with a rod or the like.

DISCLOSURE OF THE INVENTION

Problems to be Solved by the Invention

The invention is made in the above-mentioned background. A purpose of the invention is to provide an electronic apparatus that can protect a breathable film from an intentional load applied thereto and therefore can reduce damage to the breathable film.

Means for Solving the Problems

In an embodiment of the invention, an electronic apparatus comprises: a case for having a penetrating hole; a breathable film for being provided in the penetrating hole; and a protective structure for being provided outside the case so as to cover the breathable film, wherein the protective structure has an opening connecting the inside and outside of the protective structure and, in a cross-sectional view, an outside upper edge of the opening is positioned on or inside a straight line connecting an outer edge of the breathable film and an inside lower edge of the opening.

In another aspect of the invention, an electronic apparatus comprises: a case for having a penetrating hole; a cylindrical protective ring provided on the case; a ventilation cap for including a breathable film and fitting into the penetrating hole; and a protective cap for being engaged with the ventilation cap and provided opposite the penetrating hole with respect to the breathable film, wherein, in a cross-sectional view, an upper edge of an inner periphery of the protective ring is positioned on or inside a straight line connecting an outer edge of the breathable film and an outer edge of the protective cap.

In still another aspect of the invention, an electronic apparatus comprises: a case for having a penetrating hole; a cylindrical protective ring provided on the case; a ventilation cap for including a breathable film and fitting into the penetrating hole; and a protective cap for having a ventilation hole in a top surface thereof and removably provided on the protective ring and opposite the penetrating hole with respect to the breathable film, wherein, in a cross-sectional view, an outside upper edge of the ventilation hole in the protective cap is positioned on or inside a straight line connecting an outer edge of the breathable film and an inside lower edge of the ventilation hole in the protective cap.

There are other aspects of the invention as described below. This disclosure of the invention therefore intends to provide part of aspects of the invention and does not intend to limit the scope of the invention described and claimed herein.

DESCRIPTION OF THE SYMBOLS

Figure 1:
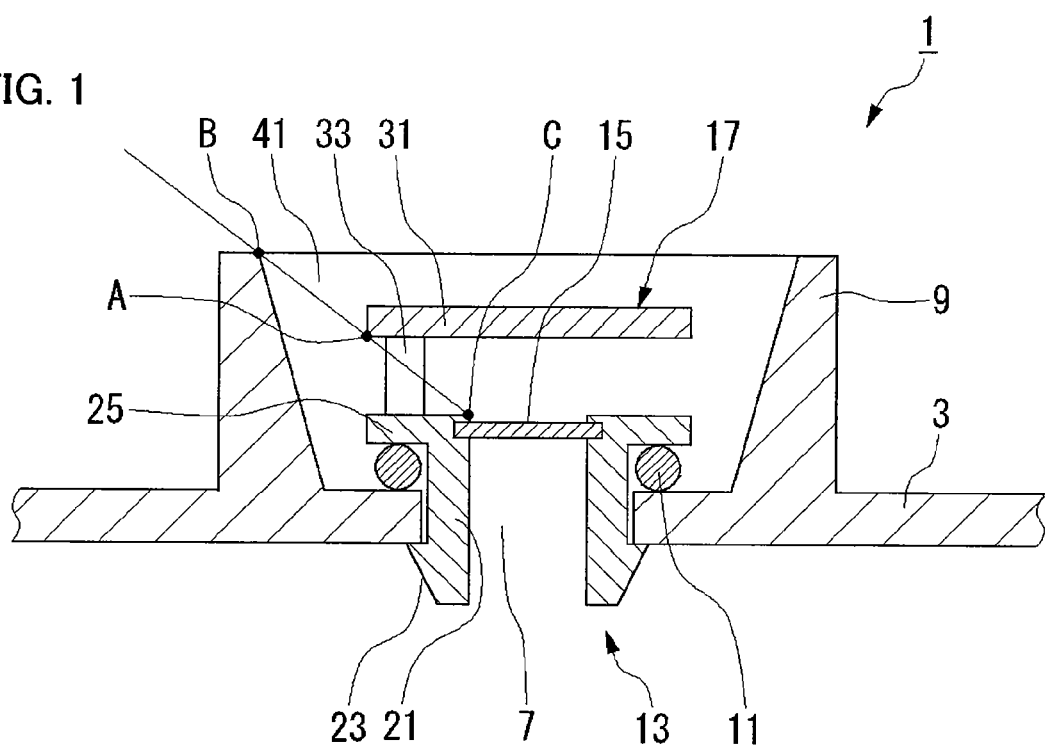
FIG. 1 is a cross section of an electronic apparatus according to a first embodiment of the invention.

1: Electronic apparatus
3: Case
7: Penetrating hole
9: Protective ring
13: Ventilation cap
15: Breathable film
17: Protective cap
41: Gap
A: Outer edge of the protective cap
B: Inside upper edge of the protective ring
C: Outer edge of the breathable film

BEST MODE OF EMBODYING THE INVENTION

Now, the invention will be described in detail. However, the following detailed description and appended drawings are not intended to limit the invention. Rather, the scope of the invention is defined by the appended claims.

This electronic apparatus comprises: a case for having a penetrating hole; a breathable film provided in the penetrating hole; and a protective structure for being provided outside the case so as to cover the breathable film, wherein the protective structure has an opening connecting the inside and outside of the protective structure and, in a cross-sectional view, an outside upper edge of the opening is positioned on or inside a straight line connecting an outer edge of the breathable film and an inside lower edge of the opening.

In this configuration, a rod or the like or a liquid jet of high pressure cleaning does not directly reach the breathable film even if it passes through the opening in the protective structure. Consequently, the breathable film can be protected from an intentional load applied thereto, and damage to the breathable film can therefore be reduced.

The breathable film may be provided in a ventilation cap fitting into the penetrating hole; the protective structure may have a cylindrical protective ring provided on the case and may have a protective cap engaged with the ventilation cap; the opening may be a gap between the protective ring and the protective cap; the inside lower edge of the opening may be an outer edge of the protective cap; and the outside upper edge of the opening may be an upper edge of an inner periphery of the protective ring. In this configuration, the gap between the protective ring and the protective cap is the opening in the protective structure. The gap is configured such that the breathable film is protected, and damage to the breathable film can therefore be suitably reduced.

Alternatively, the breathable film may be provided in a ventilation cap fitting into the penetrating hole; the protective structure may have a cylindrical protective ring provided on the case and may have a protective cap having a ventilation hole in a top surface thereof and attached to the protective ring; the ventilation hole may be the opening in the protective structure; the inside lower edge of the opening may be an inside lower edge of the ventilation hole in the protective cap; and the outside upper edge of the opening may be an outside upper edge of the ventilation hole in the protective cap. In this configuration, the ventilation hole in the protective cap is the opening in the protective structure. The ventilation hole is configured such that the breathable film is protected, and damage to the breathable film can therefore be suitably reduced.

In an embodiment, an electronic apparatus comprises: a case for having a penetrating hole; a cylindrical protective ring for being provided on the case; a ventilation cap for including a breathable film and fitting into the penetrating hole; and a protective cap for being engaged with the ventilation cap and provided opposite the penetrating hole with respect to the breathable film, wherein, in a cross-sectional view, an upper edge of an inner periphery of the protective ring is positioned on or inside a straight line connecting an outer edge of the breathable film and an outer edge of the protective cap.

Also in this configuration, a rod or the like or a liquid jet of high pressure cleaning does not directly reach the breathable film. Consequently, the breathable film can be protected from an intentional load applied thereto, and damage to the breathable film can therefore be reduced.

In another embodiment, an electronic apparatus comprises: a case for having a penetrating hole; a cylindrical protective ring for being provided on the case; a ventilation cap comprising a breathable film and fitting into the penetrating hole; and a protective cap for having a ventilation hole in a top surface thereof and removably provided on the protective ring and opposite the penetrating hole with respect to the breathable film, wherein, in a cross-sectional view, an outside upper edge of the ventilation hole in the protective cap is positioned on or inside a straight line connecting an outer edge of the breathable film and an inside lower edge of the ventilation hole in the protective cap.

Also in this configuration, a rod or the like or a liquid jet of high pressure cleaning does not directly reach the breathable film. Consequently, the breathable film can be protected from an intentional load applied thereto, and damage to the breathable film can therefore be reduced.

As described above, the invention has the protective structure provided such that, in the cross-sectional view, the outside upper edge of the opening in the protective structure is positioned on or inside the straight line connecting the outer edge of the breathable film and the inside lower edge of the opening in the protective structure. As a result, the breathable film can be protected from the intentional load applied thereto, and damage to the breathable film can therefore be reduced.

Now, electronic apparatuses of embodiments of the invention will be described with reference to the drawings.

Figure 2:
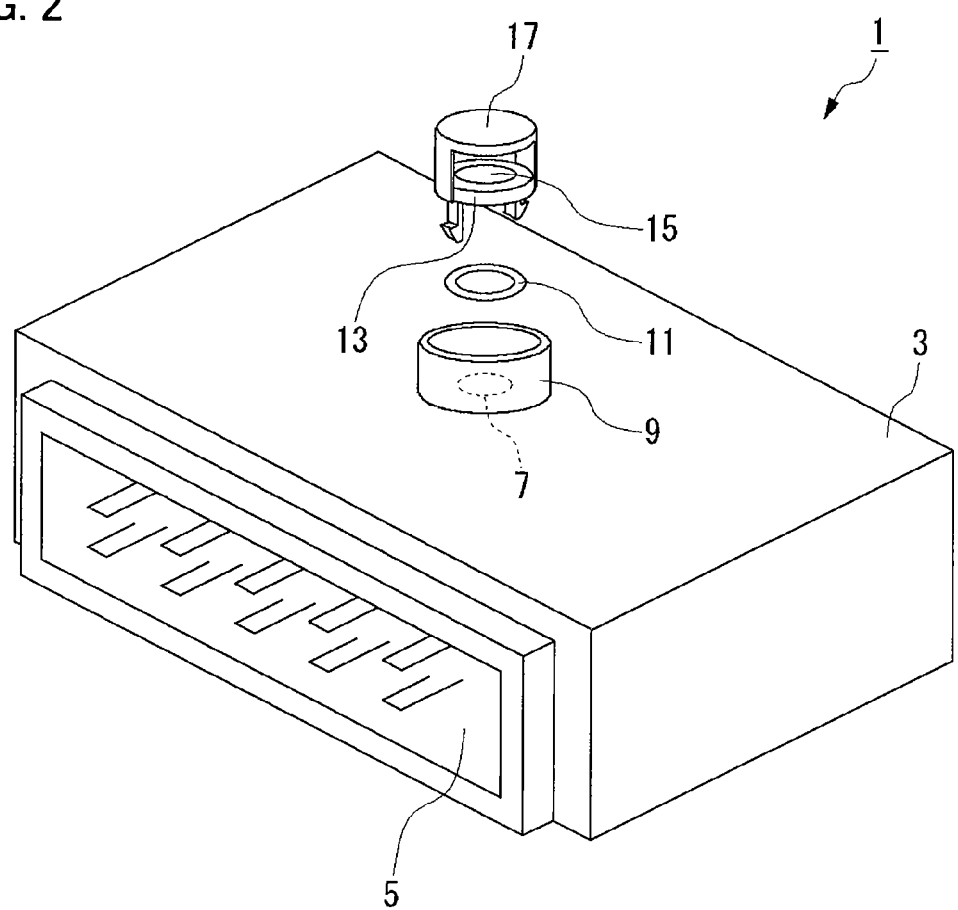
FIG. 2 is a diagonally view of the electronic apparatus according to the first embodiment of the invention.

FIG. 1 shows an electronic apparatus of a first embodiment of the invention, and FIG. 2 shows a general configuration of the electronic apparatus. Referring first to FIG. 2, the electronic apparatus 1 has a case 3 for housing inside thereof a printed circuit board mounted with an electronic component or the like. On the side of the case 3, there is provided a connector unit 5, which connects the electronic apparatus 1 to another electronic apparatus. On a top surface of the case 3, there is provided a penetrating hole 7, which penetrates and reaches inside the case 3. As a configuration for ventilation using the penetrating hole 7, the electronic apparatus 1 has a protective ring 9 (a protective ring wall), an O-ring 11, a ventilation cap 13, a breathable film 15, and a protective cap 17.

FIG. 1 shows the above configuration for ventilation in detail. In the invention, with reference to the penetrating hole 7 in FIG. 1, the side (or direction) toward the penetrating hole 7 is called the "inside," and the side (or direction) away from the penetrating hole 7 is called the "outside." The upside in FIG. 1 (i.e. outward direction of the case 3) is called the "upper side," and the downside in FIG. 1 (i.e. inward direction of the case 3) is called the "lower side."

In FIG. 1, the protective ring 9 is provided so as to surround the penetrating hole 7. The protective ring 9 comprises a cylindrical sidewall protruding from the case 3. An inside wall surface of the protective ring 9 is inclined as shown in the figure, and an inner diameter of the protective ring 9 therefore becomes larger toward the upper part.

The ventilation cap 13 is provided inside the protective ring 9, and fits into the penetrating hole 7. The ventilation cap 13 has a cylindrical fitting leg portion 21, which fits into the penetrating hole 7. On the lower end of the fitting leg portion 21 is provided with an engaging hook 23, which is engaged with an inner surface of the case 3. A disk-shaped flange portion 25 is provided on the upper end of the fitting leg portion 21, and the O-ring 11 is put between the flange portion 25 and the case 3. The outside of the ventilation cap 13 and the case 3 are sealed therebetween with the O-ring 11.

The breathable film 15 is provided near the top of the ventilation cap 13 as a film mount so as to stop up a hole in the center of the ventilation cap 13. The breathable film 15 blocks passage of liquid and allows passage of air, and therefore allows air to flow into and out of the case 3.

The protective cap 17 is provided opposite the penetrating hole 7 with reference to the breathable film 15, and is engaged with the ventilation cap 13. The protective cap 17 comprises a disk portion 31 and a leg portion 33. The disk portion 31 is placed above the breathable film 15, leaving a gap therebetween. The diameter of the disk portion 31 is almost the same as the outer diameter of the ventilation cap 13, and is therefore larger than the diameter of the breathable film 15. The protective cap 17 thus covers the breathable film 15 with the disk portion 31.

The leg portion 33 of the protective cap 17 extends downward from an edge of the disk portion 31. An engaging portion of the tip of the leg portion 33 is engaged with the flange portion 25 of the ventilation cap 13. As shown in FIG. 1, two leg portions 33 are provided on both sides of the disk portion 31. The two leg portions 33 thus hold the disk portion 31 above the breathable film 15.

In FIG. 1, a point A is an outside lower edge of the protective cap 17; a point B is an upper edge of an inner periphery of the protective ring; and a point C is an outer edge of the breathable film 15. In the embodiment, the point B is positioned on a straight line connecting the points A and C. The shapes of the protective ring 9 and other components are set so as to provide such a positional relationship.

Since the points A, B, and C have the above positional relationship, a rod entering a gap 41 between the protective ring 9 and the protective cap 17 from outside could not be allowed to reach the breathable film 15, as described below.

Figure 3:
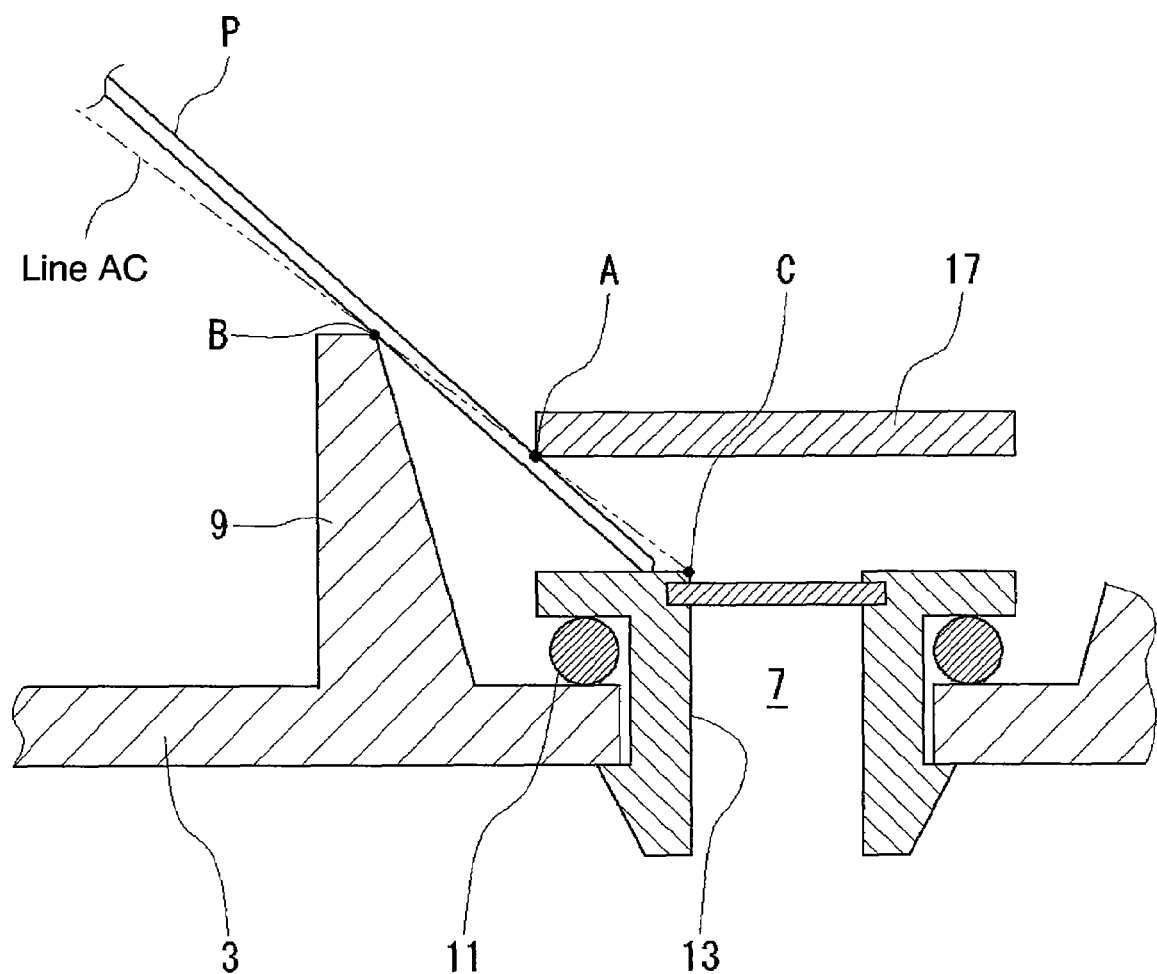
FIG. 3 shows a state where a rod is inserted into the electronic apparatus according to the first embodiment of the invention.

When an attempt is made to make a rod reach the breathable film 15, the rod P is put into the gap 41 at the lowest angle possible as shown in FIG. 3. At this time, one side of the rod P comes into contact with the protective ring 9 at the point B, and the opposite side of the rod P comes into contact with the protective cap 17 down the rod P at the point A. The points B and A thus limit the angle of the rod P. However, even when the rod P is inserted at as low an angle as possible like this, the rod P meets the ventilation cap 13 outside the periphery of the breathable film 15 as shown in FIG. 3 and cannot reach the breathable film 15, if the point B is positioned on the line extending through the points A and C.

As described above, in the embodiment, even if an attempt is made to make a rod or the like get in from outside to poke the breathable film 15, the inside upper edge of the protective ring 9 (i.e. point B) and the outer edge of the protective cap 17 (i.e. point A) limit the direction of the rod, and therefore the rod cannot be made to reach the breathable film 15. As a result, it is impossible to intentionally damage the breathable film 15 with a rod. The same holds for a liquid jetted for high pressure cleaning. As in the case of a rod-like object, a straight-going liquid jet cannot reach the breathable film 15.

In the embodiment, the outer edge of the breathable film 15, the point C, is actually an upper edge shoulder of the center hole in the ventilation cap 13. In the invention, the outer edge of the breathable film is allowed to be a point through which the outermost path reachable to the breathable film should pass. From this point of view, in the example of the embodiment, a shoulder of a hole like the above is treated as the outer edge of the breathable film.

In the embodiment, the protective ring 9 and the protective cap 17 correspond to the protective structure covering the breathable film 15 outside the case 3. The gap 41 between the protective ring 9 and the protective cap 17 corresponds to the opening communicatively connecting the inside and outside spaces of the protective structure. The points A and B correspond to the inside lower edge and outside upper edge of the ventilation opening, respectively. And, in a cross-sectional view, the outside upper edge of the opening (i.e. point B) is positioned on a straight line connecting the outer edge of the breathable film 15 (i.e. point C) and the inside lower edge of the opening (i.e. point A). Consequently, a rod or the like cannot reach the breathable film 15.

In the embodiment, the point B is positioned on the straight line connecting the points A and C. Alternatively, the point B may be positioned inside the straight line connecting the points A and C. In this case, again, a rod or a liquid jet cannot reach the breathable film 15.

The above is a description of the electronic apparatus 1 of the first embodiment of the invention. In the embodiment, the protective structure is provided such that, in the cross-sectional view of FIG. 2, the outside upper edge of the opening in the protective structure (i.e. point B) is positioned on or inside the straight line connecting the outer edge of the breathable film 15 (i.e. point C) and the inside lower edge of the opening in the protective structure (i.e. point A). Consequently, the breathable film 15 can be protected from an intentional load applied thereto, and damage to the breathable film 15 can therefore be reduced.

In the embodiment, the protective ring 9 and the like are formed such that the inside upper edge of the protective ring 9 (i.e. point B) is positioned on or inside the straight line connecting the outer edge of the breathable film 15 (i.e. point C) and the outer edge of the protective cap 17 (i.e. point A). Consequently, the breathable film 15 can be protected from an intentional load applied thereto, and damage to the breathable film 15 can therefore be reduced.

Preferably, the electronic apparatus 1 of the embodiment is placed such that the ventilation-related configuration of FIG. 2 faces laterally, that is, the film surface of the breathable film 15 is upright. This can prevent water or the like from collecting inside the protective ring 9. Since the inner periphery surface of the protective ring 9 is inclined, discharge of water or the like is suitably facilitated.

In a variation of the embodiment, the breathable film, the protective ring, the protective cap, and the like may not be circular. These may be, for example, polygonal. Such a configuration is included in the scope of the invention.

Figure 4:
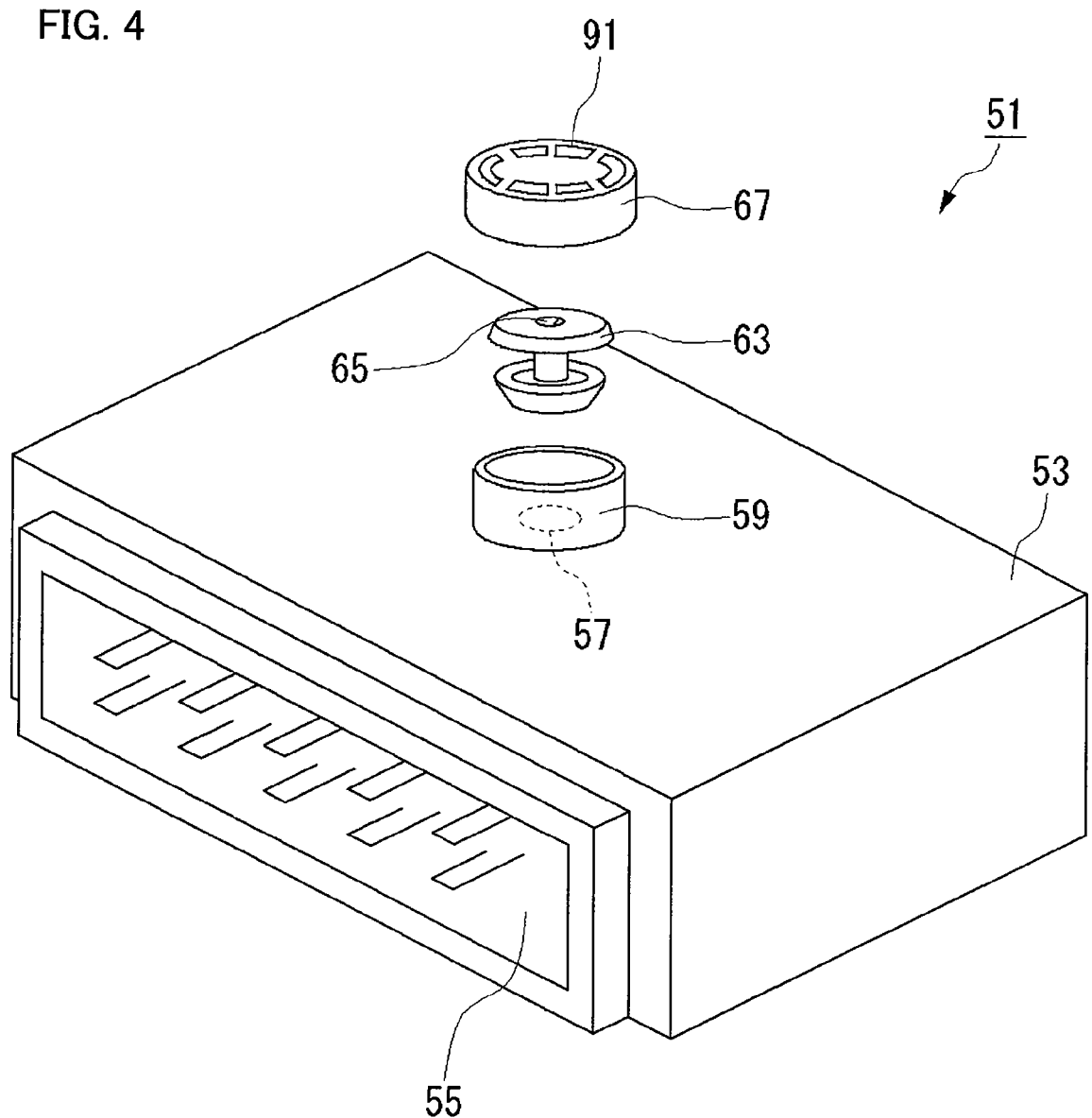
FIG. 4 is a diagonally view of an electronic apparatus according to a second embodiment of the invention.
Figure 5:
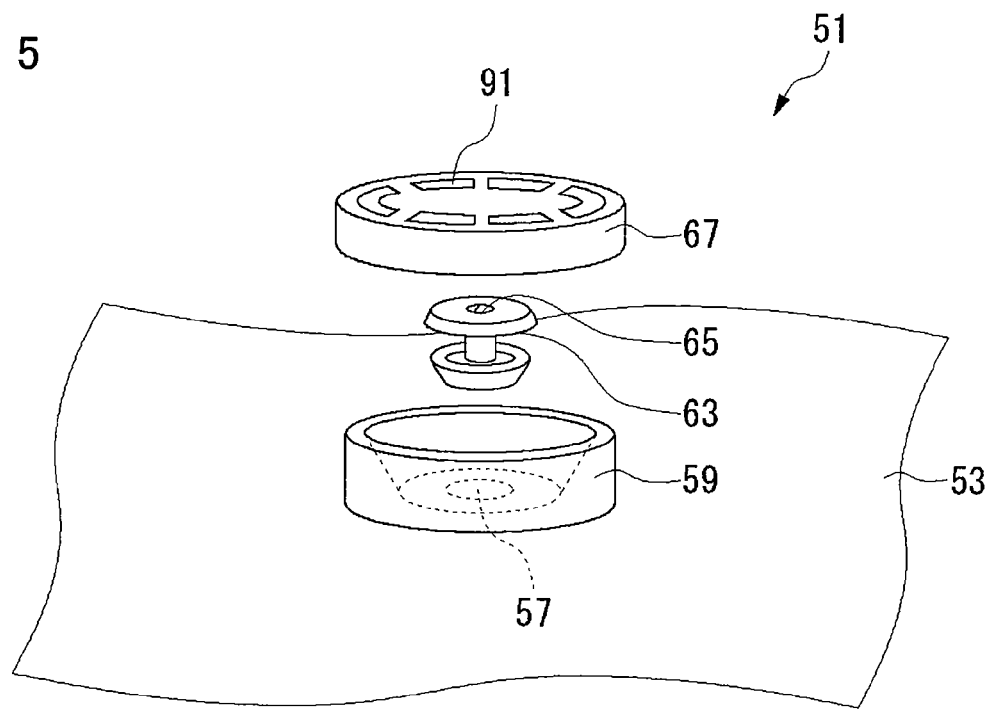
FIG. 5 is a magnified diagonally view of the electronic apparatus according to the second embodiment of the invention.

In the next place, FIGS. 4 and 5 show an electronic apparatus of a second embodiment of the invention. Unlike the electronic apparatus of the first embodiment of the invention, it is assumed in the electronic apparatus of the second embodiment of the invention that a protective cap for protecting a ventilation cap cannot be attached to the ventilation cap. In the embodiment, the protective cap is not attached to the ventilation cap but to a protective ring.

In FIGS. 4 and 5, the electronic apparatus 51 has a case 53 for housing inside thereof a printed circuit board mounted with an electronic component or the like. On the side of the case 53, there is provided a connector unit 55, which connects the electronic apparatus 51 to another electronic apparatus. On a top surface of the case 53, there is provided a penetrating hole 57, which penetrates and reaches inside the case 53. As a configuration for ventilation using the penetrating hole 57, the electronic apparatus 51 has a protective ring 59, a ventilation cap 63, a breathable film 65, and a protective cap 67.

Figure 6:
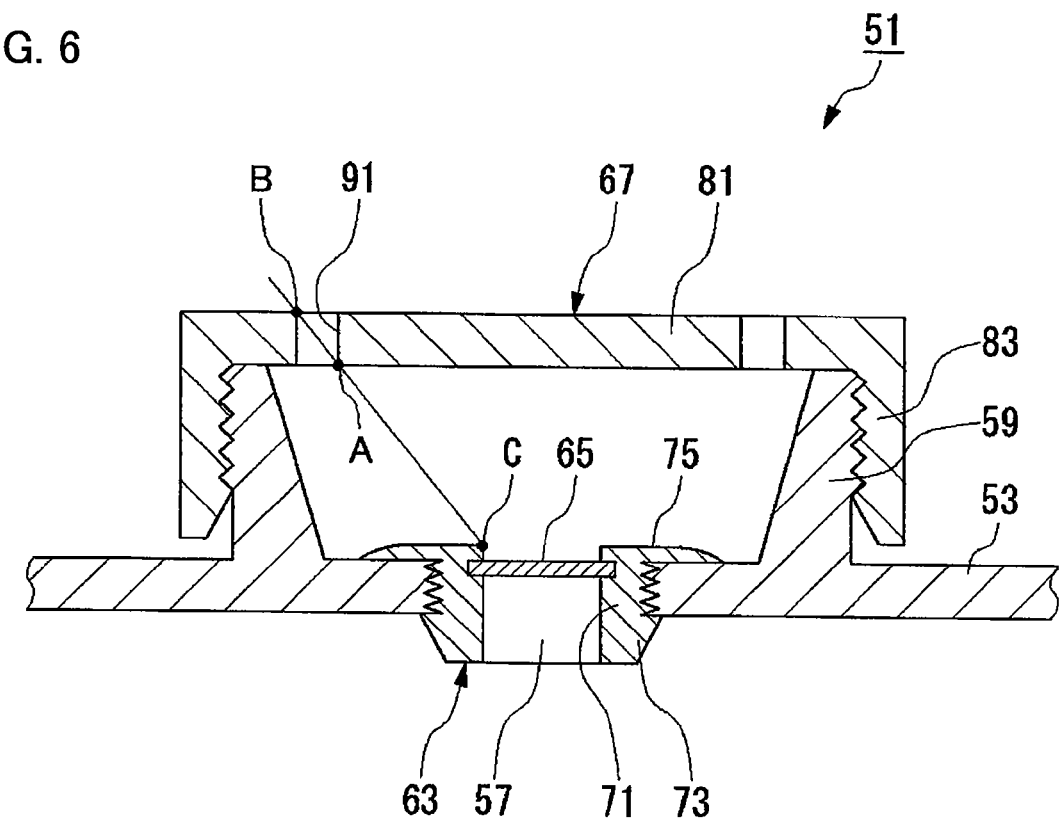
FIG. 6 is a cross section of the electronic apparatus according to the second embodiment of the invention.
Figure 7:
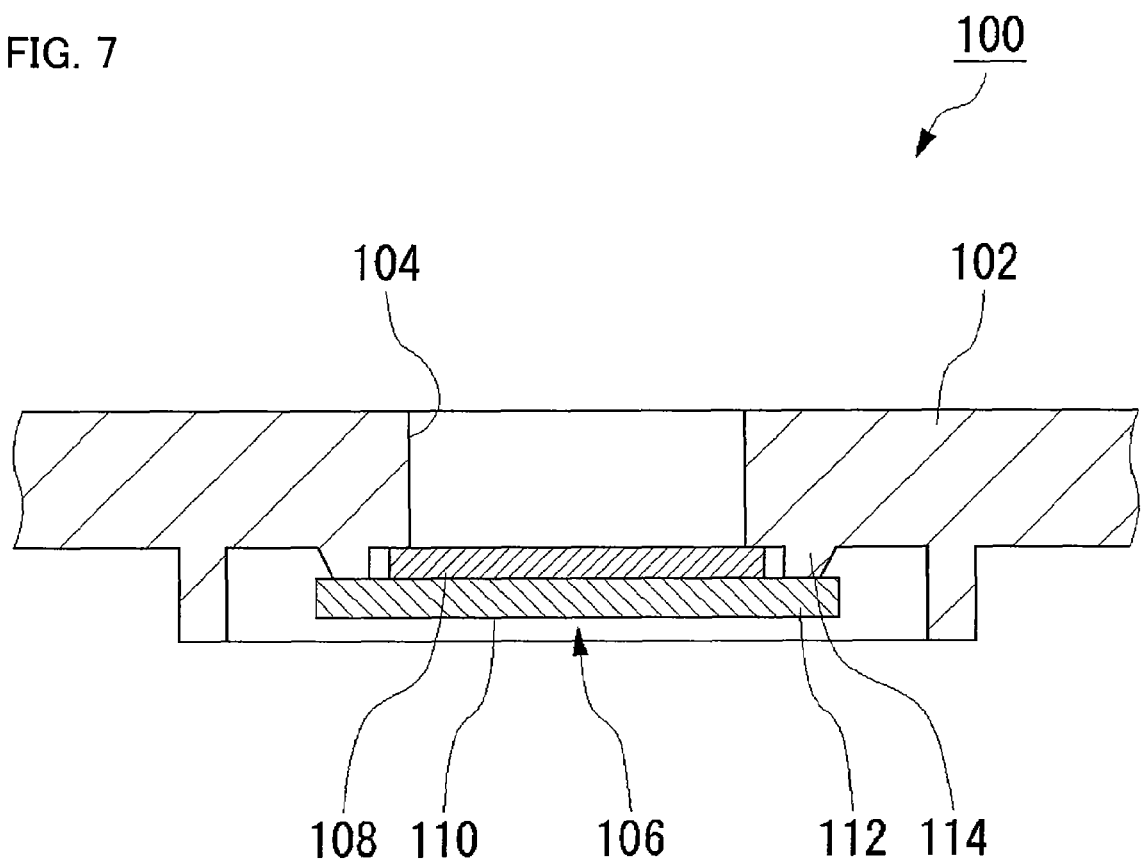
FIG. 7 shows a conventional electronic apparatus.

FIG. 6 shows the above configuration for ventilation in detail. In the embodiment, as in the first embodiment, with reference to the penetrating hole 57 in FIG. 6, the side (or direction) toward the penetrating hole 57 is called the "inside," and the side (or direction) away from the penetrating hole 57 is called the "outside." The upside in FIG. 6 (i.e. outward direction of the case 53) is called the "upper side," and the downside in FIG. 6 (i.e. inward direction of the case 53) is called the "lower side."

In FIG. 6, the protective ring 59 is provided so as to surround the penetrating hole 57. The protective ring 59 comprises a cylindrical sidewall protruding from the case 53. An inside wall surface of the protective ring 59 is inclined as shown in the figure, and an inner diameter of the protective ring 59 therefore becomes larger toward the upper part.

The ventilation cap 63 is provided inside the protective ring 59, and fits into the penetrating hole 57. The ventilation cap 63 has a cylindrical portion 71, which fits into the penetrating hole 57. Projections and depressions on an outer periphery of the cylindrical portion 71 are engaged with projections and depressions on an inner periphery of the penetrating hole 57. With this structure, the outside of the ventilation cap 63 and the case 53 are sealed therebetween. On the lower end of the cylindrical portion 71 is provided an engaging hook 73, which is engaged with an inner surface of the case 53. On the upper end of the cylindrical portion 71 is provided a disk-shaped flange portion 75, which is in close contact with a top surface of the case 53. The ventilation cap 63 is pressed into the penetrating hole 57 from outside the case 53. The cylindrical portion 71 is deformed; the engaging hook 73 is deformed to reach inside the case 53; and the ventilation cap 63 is therefore fixed to the case 53 as shown in the figure.

The breathable film 65 is provided near the top of the ventilation cap 63 so as to stop up a hole in the center of the ventilation cap 63. The breathable film 65 blocks passage of liquid and allows passage of air, and therefore allows air to flow into and out of the case 53.

The protective cap 67 is provided opposite the penetrating hole 57 with reference to the breathable film 65, and covers the breathable film 65. In the above-described first embodiment, the protective cap is attached to the ventilation cap. In the second embodiment, the protective cap 67 is not fixed to the ventilation cap 63. The protective cap 67 is fixed to the protective ring 59 so as to cover the whole protective ring 59.

The protective cap 67 comprises a disk portion 81, and a cylindrical portion 83 provided on the rim of the disk portion 81. The cylindrical portion 83 fits onto the outside of the protective ring 59, the whole of which is therefore covered with the protective cap 67.

In the embodiment, an inner surface of the cylindrical portion 83 of the protective cap 67 is provided with an internal thread, and an outer peripheral surface of the protective ring 59 is provided with an external thread. The protective cap 67 is fixed to the protective ring 59, and the protective cap 67 is thus removably provided on the protective ring 59. Within the scope of the invention, the protective cap 67 may be attached to the protective ring 59 with an adhesive. The protective cap 67 and the protective ring 59 may also be assembled with a press fit. The two may also be assembled in another configuration.

As the figure shows, a ventilation hole 91 is provided in a top surface of the protective cap 67. As shown in FIGS. 4 and 5, each ventilation hole 91 is formed with a long narrow arc-shaped hole or slit. A plurality of ventilation holes 91 are circularly arranged so as to surround the breathable film 65.

In the embodiment, an outside upper edge of the ventilation hole 91 (i.e. point B) is positioned on a straight line connecting an inside lower edge of the ventilation hole 91 (i.e. point A) and an outer edge of the breathable film 65 (i.e. point C). The position and shape of the ventilation hole 91 are set so as to provide such a positional relationship, and so are the shapes of the protective ring 59, protective cap 67, and other members.

Since the points A, B, and C have the above positional relationship, a rod-like object cannot be allowed to reach the breathable film 65 from outside, also in the embodiment, as in the first embodiment.

When an attempt is made to make a rod reach the breathable film 65, the rod is put into the ventilation hole 91 at the lowest angle possible. The points B and A limit the angle of the rod. However, even when the rod is inserted at as low an angle as possible, the rod meets the ventilation cap 63 outside the periphery of the breathable film 65 and cannot reach the breathable film 65, if the point B is positioned on the line extending through the points A and C.

As described above, in the embodiment, even if an attempt is made to make a rod or the like get in from outside to poke the breathable film 65, the outside upper edge (i.e. point B) and inside lower edge (i.e. point A) of the ventilation hole 91 limit the direction of the rod, and therefore the rod cannot be made to reach the breathable film 65. As a result, it is impossible to intentionally damage the breathable film 65 with a rod. The same holds for a liquid jetted for high pressure cleaning. As in the case of a rod-like object, a straight-going liquid jet cannot reach the breathable film 65.

Also in the embodiment, as in the first embodiment, the outer edge of the breathable film (i.e. point C) is actually an upper edge shoulder of the center hole in the ventilation cap 63. In the invention, the outer edge of the breathable film is allowed to be a point through which the outermost path capable of reaching the breathable film should pass. From this point of view, in the example of the embodiment, a shoulder of a hole like the above is treated as the outer edge of the breathable film.

In the embodiment, the protective ring 59 and the protective cap 67 correspond to the protective structure covering the breathable film 65 outside the case 53. The ventilation hole 91 in the protective cap 67 corresponds to the opening communicatively connecting the inside and outside spaces of the protective structure. The points A and B correspond to the inside lower edge and outside upper edge of the ventilation opening, respectively. And, in a cross-sectional view, the outside upper edge of the opening (i.e. point B) is positioned on a straight line connecting the outer edge of the breathable film 65 (i.e. point C) and the inside lower edge of the opening (i.e. point A). Consequently, a rod or the like cannot reach the breathable film 65.

In the embodiment, the point B is positioned on the straight line connecting the points A and C. Alternatively, the point B may be positioned inside the straight line connecting the points A and C. In this case, again, a rod or a liquid jet cannot reach the breathable film 65.

The above is a description of the electronic apparatus 51 of the second embodiment of the invention. In the second embodiment, as in the first embodiment, the protective structure is provided such that, in the cross-sectional view of FIG. 6, the outside upper edge of the opening in the protective structure (i.e. point B) is positioned on or inside the straight line connecting the outer edge of the breathable film 65 (i.e. point C) and the inside lower edge of the opening in the protective structure (i.e. point A). Consequently, the breathable film 65 can be protected from an intentional load applied thereto, and damage to the breathable film 65 can therefore be reduced.

In the embodiment, the outside upper edge of the ventilation hole 91 (i.e. point B) is positioned on or inside the straight line connecting the outer edge of the breathable film 65 (i.e. point C) and the inside lower edge of the ventilation hole 91 (i.e. point A). Consequently, the breathable film 65 can be protected from an intentional load applied thereto, and damage to the breathable film 65 can therefore be reduced.

As in the first embodiment, the electronic apparatus 51 of the embodiment is preferably placed such that the ventilation-related configuration of FIG. 6 faces laterally, that is, the film surface of the breathable film 65 is upright. This can prevent water or the like from collecting inside the protective ring 59. Since the inner periphery surface of the protective ring 59 is inclined, discharge of water or the like is suitably facilitated.

In a variation of the embodiment, as in the first embodiment, the breathable film, the protective ring, the protective cap, and the like may not be circular. These may be, for example, polygonal. Such a configuration is included in the scope of the invention.

While there has been described what are at present considered to be preferred embodiments of the invention, it will be understood that various modifications and variations may be made thereto, and it is intended that appended claims cover all such modifications and variations as fall within the true spirit and scope of the invention.

INDUSTRIAL APPLICABILITY

As described up to this point, the electronic apparatus according to the invention can protect a breathable film from an intentional load applied thereto, and therefore can reduce damage to the film. The apparatus has this advantage and is useful as an electronic apparatus or the like having a means of ventilation.

The invention claimed is:

1. An electronic apparatus comprising:
a case for having a penetrating hole;
a breathable film for being provided in said penetrating hole; and
a protective structure for being provided outside said case so as to cover said breathable film, wherein
said protective structure has an opening connecting the inside and outside of said protective structure and,
in a cross-sectional view, an outside upper edge of said opening is positioned on or inside a straight line connecting an outer edge of said breathable film and an inside lower edge of said opening.

2. The electronic apparatus according to claim 1, wherein:
said breathable film is provided in a ventilation cap fitting into said penetrating hole;
said protective structure has a cylindrical protective ring provided on said case and has a protective cap engaged with said ventilation cap;
said opening is a gap between said protective ring and said protective cap;
said inside lower edge of said opening is an outer edge of said protective cap; and
said outside upper edge of said opening is an upper edge of an inner periphery of said protective ring.

3. The electronic apparatus according to claim 1, wherein:
said breathable film is provided in a ventilation cap fitting into said penetrating hole;
said protective structure has a cylindrical protective ring provided on said case and has a protective cap having a ventilation hole in a top surface thereof and attached to said protective ring;
said ventilation hole is said opening in said protective structure;
said inside lower edge of said opening is an inside lower edge of said ventilation hole in said protective cap; and
said outside upper edge of said opening is an outside upper edge of said ventilation hole in said protective cap.

4. An electronic apparatus comprising:
a case for having a penetrating hole;
a cylindrical protective ring for being provided on said case;
a ventilation cap for including a breathable film and fitting into said penetrating hole; and
a protective cap for being engaged with said ventilation cap and provided opposite said penetrating hole with respect to said breathable film, wherein
in a cross-sectional view, an upper edge of an inner periphery of said protective ring is positioned on or inside a straight line connecting an outer edge of said breathable film and an outer edge of said protective cap.

5. An electronic apparatus comprising:
a case for having a penetrating hole;
a cylindrical protective ring for being provided on said case;
a ventilation cap for including a breathable film and fitting into said penetrating hole; and
a protective cap for having a ventilation hole in a top surface thereof and removably provided on said protective ring and opposite said penetrating hole with respect to said breathable film, wherein
in a cross-sectional view, an outside upper edge of said ventilation hole in said protective cap is positioned on or inside a straight line connecting an outer edge of said breathable film and an inside lower edge of said ventilation hole in said protective cap.

* * * * *